US011189591B2

(12) United States Patent
Ikeda et al.

(10) Patent No.: US 11,189,591 B2
(45) Date of Patent: Nov. 30, 2021

(54) ELECTRONIC MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 727 days.

(21) Appl. No.: 15/779,679

(22) PCT Filed: May 19, 2017

(86) PCT No.: PCT/JP2017/018810
§ 371 (c)(1),
(2) Date: May 29, 2018

(87) PCT Pub. No.: WO2018/211680
PCT Pub. Date: Nov. 22, 2018

(65) Prior Publication Data
US 2021/0183807 A1    Jun. 17, 2021

(51) Int. Cl.
*H01L 23/495*    (2006.01)
*H01L 21/44*    (2006.01)
(Continued)

(52) U.S. Cl.
CPC ........ *H01L 24/37* (2013.01); *H01L 23/49575* (2013.01); *H01L 24/32* (2013.01);
(Continued)

(58) Field of Classification Search
CPC ......... H01L 24/29; H01L 24/37; H01L 24/40; H01L 23/49575
(Continued)

(56) References Cited

U.S. PATENT DOCUMENTS 5,218,231 A * 6/1993 Kudo ...................... H01L 24/36
257/735
7,557,434 B2 * 7/2009 Malhan ................... H01L 24/72
257/678
(Continued)

FOREIGN PATENT DOCUMENTS

EP    2506300 A2    2/2012
JP    2000164800 A    6/2000
(Continued)

OTHER PUBLICATIONS

Office Action and Search Report from NL app. No. 2020926, dated Jan. 1, 2019.
(Continued)

*Primary Examiner* — Calvin Lee
(74) *Attorney, Agent, or Firm* — Ladas & Parry, LLP

(57) ABSTRACT

An electronic module has a first electronic unit having a first substrate 11, a first conductor layer 12 provided on one side of the first substrate 11, and a first electronic element 13 provided on one side of the first conductor layer 12, a first connection body 60 provided on one side of the first electronic element 13, and a second electronic unit having a second electronic element 23 provided on one side of the first connection body 60. The first connection body 60 has a first head part 61 and a plurality of support parts 65 extending from the first head part 61. The electronic module is characterized by that the support part 65 abuts on the first substrate 11 or the first conductor layer 12.

9 Claims, 14 Drawing Sheets

(51) Int. Cl.
  *H01L 23/00* (2006.01)
  *H01L 25/07* (2006.01)
  *H01L 25/18* (2006.01)
(52) U.S. Cl.
  CPC ............ *H01L 24/40* (2013.01); *H01L 25/074* (2013.01); *H01L 25/18* (2013.01); *H01L 2224/32227* (2013.01); *H01L 2224/32245* (2013.01); *H01L 2224/404* (2013.01); *H01L 2224/4007* (2013.01)
(58) Field of Classification Search
  USPC .......................... 438/611–614; 257/672, 776
  See application file for complete search history.

(56) References Cited

U.S. PATENT DOCUMENTS

| | | | |
|---|---|---|---|
| 8,492,884 B2* | 7/2013 | Pruitt | .................... H01L 23/495 257/676 |
| 9,704,819 B1* | 7/2017 | Gao | ........................ H01L 24/92 |
| 9,893,641 B2* | 2/2018 | Nakajima | ............. H01L 25/074 |
| 2002/0006685 A1 | 1/2002 | Petitbon et al. | |
| 2002/0043708 A1 | 4/2002 | Muto et al. | |
| 2009/0194856 A1 | 8/2009 | Gomez | |
| 2010/0193921 A1 | 8/2010 | Jereza et al. | |
| 2010/0265024 A1 | 10/2010 | Nakashiba | |
| 2011/0298114 A1 | 12/2011 | Pruitt | |
| 2012/0200281 A1 | 8/2012 | Herbsommer et al. | |
| 2014/0197525 A1 | 7/2014 | Kadoguchi et al. | |
| 2015/0262915 A1 | 9/2015 | Suzuki | |
| 2016/0099224 A1 | 4/2016 | Yoshimatsu et al. | |
| 2016/0148902 A1 | 5/2016 | Chen et al. | |
| 2016/0254250 A1 | 9/2016 | Ikeda et al. | |
| 2017/0092568 A1 | 3/2017 | Ikeda | |

FOREIGN PATENT DOCUMENTS

| | | |
|---|---|---|
| JP | 2002093977 A | 3/2002 |
| JP | 2003318208 A | 11/2003 |
| JP | 2010245212 A | 10/2010 |
| JP | 2011142172 A | 7/2011 |
| JP | 2012248658 A | 12/2012 |
| JP | 2014045157 A | 3/2014 |
| JP | 2014511027 A | 5/2014 |
| JP | 2015176916 A | 10/2015 |
| JP | 2016072575 A | 5/2016 |
| JP | 2002076254 A | 3/2018 |
| WO | 2009032537 A1 | 3/2009 |
| WO | 2011156051 A1 | 12/2011 |
| WO | 2012109265 A2 | 8/2012 |
| WO | 2012157069 A1 | 11/2012 |
| WO | 2016174698 A1 | 11/2016 |

OTHER PUBLICATIONS

Office Action from JP app. No. 2018509937, dated Jan. 15, 2019, with machine English translation provided by Google Translate.
International Search Report from PCT/JP2017/018810, dated Aug. 1, 2017 with English translation from WIPO.
International Search Report for PCT/JP2017/018810, dated Aug. 1, 2017, and its English translation provided by Google Translate.
International Preliminary Examination Report (Chapter II) for PCT/JP2017/018810, dated Oct. 13, 2017, and its English translation provided by Google Translate.
Written Opinion for PCT/JP2017/018810, dated Aug. 1. 2017, and its English translation provided by Google Translate.

* cited by examiner

000
ELECTRONIC MODULE

CROSS-REFERENCE TO RELATED APPLICATION

The present application is the U.S. national phase of PCT Application PCT/JP2017/018810 filed on May 19, 2017, the disclosure of which is incorporated herein by reference in its entirety.

TECHNICAL FIELD

The present invention relates to an electronic module.

BACKGROUND ART

An electronic module in which a plurality of electronic elements are provided in a sealing resin has been conventionally known (for example, see Japanese Patent Application Laid-open No. 2014-45157). It is desired to downsize such an electronic module.

As one means for downsizing, it is conceivable to employ an aspect in which electronic elements are stacked in layers. In such a case, it is conceivable to provide a connection body on one side (for example, a front face side) of an electronic element and provide another electronic element on one side of the connection body.

When adopting the aspect in which the electronic element is provided on the connection body in this manner, there is a possibility that the connection body is inclined due to the weight of a second electronic element at the time of mounting the second electronic element or after mounting the second electronic element. In addition, since a first electronic element and the second electronic element are positioned at adjacent positions, heat is easily confined so that it is necessary to enhance heat dissipation.

SUMMARY OF INVENTION

Technical Problem

The present invention provides an electronic module that can prevent a connection body from being inclined due to the weight of a second electronic element at the time of mounting the second electronic element or after mounting the second electronic element, and provide high heat dissipation.

Solution to Problem

An electronic module according to the present invention may comprise:
a first electronic unit having a first substrate, a first conductor layer provided on one side of the first substrate, and a first electronic element provided on one side of the first conductor layer;
a first connection body provided on one side of the first electronic element; and
a second electronic unit having a second electronic element provided on one side of the first connection body,
wherein the first connection body may have a first head part and a plurality of support parts extending from the first head part, and
the support part may abut on the first substrate or the first conductor layer.

In the electronic module according to the present invention,
the plurality of support parts may be connected to the first conductor layer, and
the first conductor layer connected to the support part may not be electrically connected to another first conductor layer, the first electronic element, and the second electronic element.

In the electronic module according to the present invention,
three or more support parts may be provided.

In the electronic module according to the present invention,
the support part may extend linearly from the face on the other side of the first head part toward the first substrate or the first conductor layer.

In the electronic module according to the present invention,
the first head part may have a substantially rectangular shape in a plan view,
the support parts may be provided to correspond to three sides or four sides of the first head part.

In the electronic module according to the present invention,
the first connection body may have a first pillar part extending from the first head part to the other side.

In the electronic module according to the present invention,
the first electronic element may be exposed from the first head part in a plan view.

In the electronic module according to the present invention,
a second connection body may be provided on one side of the second electronic element.

In the electronic module according to the present invention,
the second connection body may have a second head part and a second pillar part extending from the second head part to the other side.

An electronic module may comprise
a first electronic unit having a first substrate, and a first electronic element provided on one side of the first substrate;
a first connection body provided on one side of the first electronic element; and
a second electronic unit having a second electronic element provided on one side of the first connection body,
wherein the first connection body has a first head part and a plurality of support parts extending from the first head part,
the first substrate is a metal substrate,
the support part abuts on the first substrate.

Advantageous Effects of Invention

When the aspect in which the plurality of support parts extending from the first head part are provided and the support parts abut on the first substrate or the first conductor layer is used, the first connection body can be prevented from being inclined due to the weight of the second electronic element at the time of mounting the second electronic element or after mounting the second electronic element. In addition, since the plurality of support parts abut on the first substrate or the first conductor layer in this manner, the heat dissipation can be enhanced.

DESCRIPTION OF EMBODIMENTS

First Embodiment

Configuration

Figure 1:
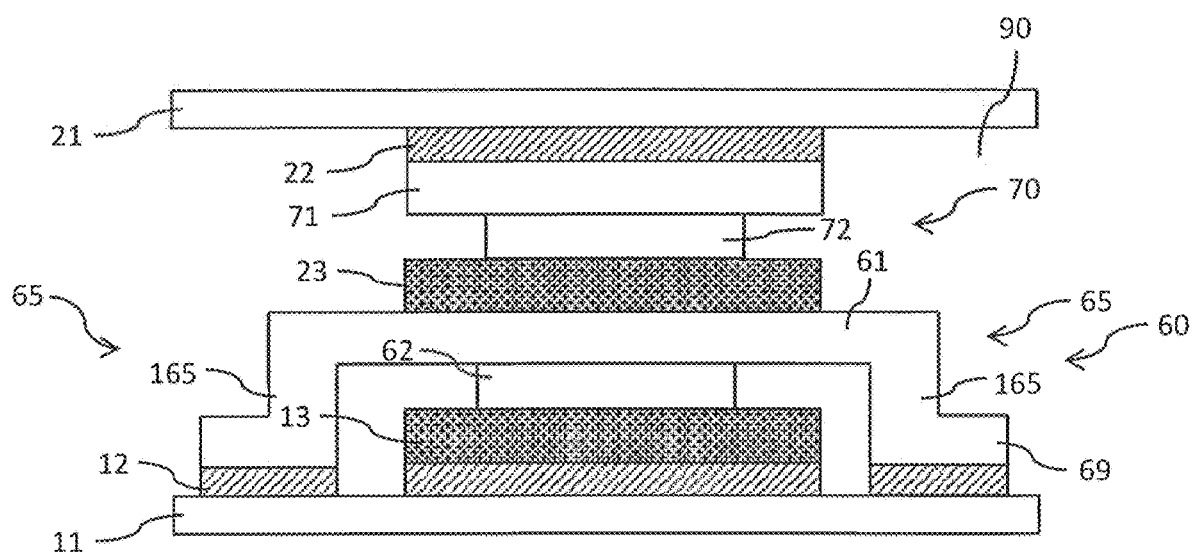
FIG. 1 is a longitudinal sectional view of an electronic module that can be used in a first embodiment of the present invention.
Figure 1:
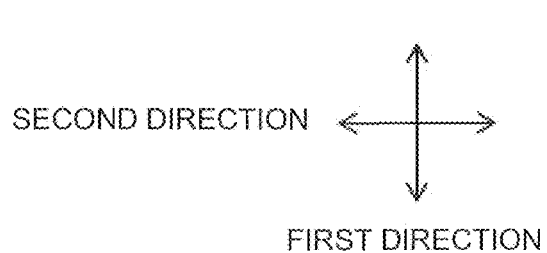

In the present embodiment, "one side" means the upper side in FIG. 1, and the "other side" means the lower side in FIG. 1. The vertical direction in FIG. 1 is referred to as a "first direction", the left-and-right direction is referred to as a "second direction", and the front-and-back direction of the paper is referred to as a "third direction". The in-plane direction including the second direction and the third direction is referred to as a "plane direction", and the case of being viewed from one side is referred to as a "plan view".

An electronic module of the present embodiment may have a first electronic unit and a second electronic unit.

As illustrated in FIG. 1, the first electronic unit may have a first substrate 11, a plurality of first conductor layers 12 provided on one side of the first substrate 11, and a first electronic element 13 provided on one side of the first conductor layer 12. The first electronic element 13 may be a switching element or a control element. When the first electronic element 13 is the switching element, the first electronic element 13 may be a MOSFET, an IGBT, or the like. Each of the first electronic element 13 and a second electronic element 23 to be described later may be configured using a semiconductor element, and a semiconductor material may be silicon, silicon carbide, gallium nitride, or the like. A face on the other side of the first electronic element 13 may be connected to the first conductor layer 12 via a conductive adhesive such as solder.

A first connection body 60 may be provided on one side of the first electronic element 13. The first connection body 60 may have a first head part 61 and a plurality of support parts 65 extending from the first head part 61 to the other side. Three or more support parts 65 may be provided.

Figure 2:
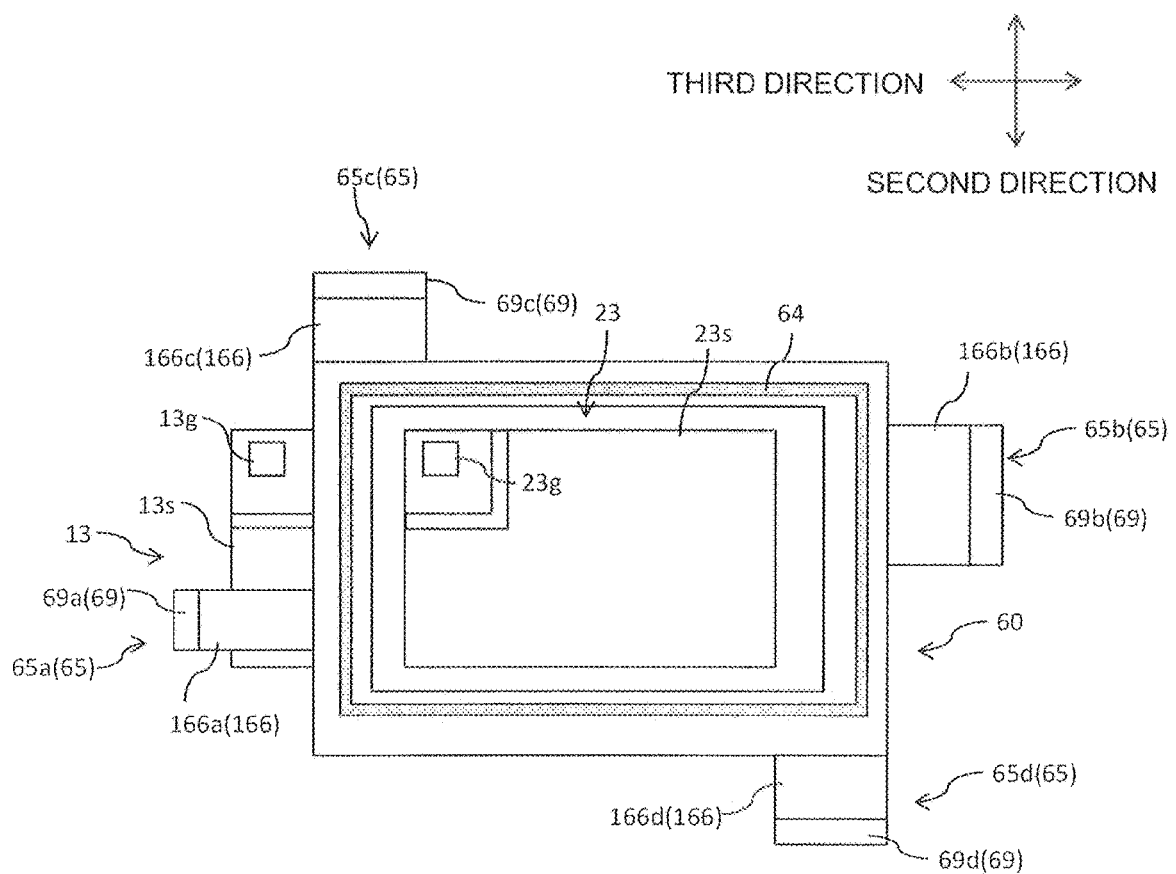
FIG. 2 is a plan view of an electronic module that can be used in the first embodiment of the present invention.

As illustrated in FIG. 2, four support parts 65 (65a to 65d) are provided in one aspect of the present embodiment, but the invention is not limited thereto, and for example, three support parts 65 may be used as will be illustrated in a second embodiment. The first connection body 60 may be connected to a face on one side of the first electronic element 13 via a conductive adhesive such as solder. The support parts 65 may have support proximal end parts 69 (69a to 69d), respectively, extending in the plane direction and abutting on the first substrate 11 or the first conductor layer 12. Incidentally, the electronic module illustrated in FIG. 2 and the electronic module illustrated in FIG. 1 are different electronic modules, and the description is given with different examples.

As illustrated in FIG. 1, a second electronic unit may be provided on one side of the first connection body 60. The second electronic unit may have the second electronic element 23 provided on one side of the first connection body 60. The second electronic unit may have a second substrate 21 and a second conductor layer 22 provided on the other side of the second substrate 21. A second connection body 70 may be provided on the other side of the second conductor layer 22.

When the second conductor layer 22 is provided, the second electronic element 23 may be provided in the second conductor layer 22, which is different from the aspect illustrated in FIG. 1. The second connection body 70 may be connected to a face on one side of the second electronic element 23 and a face on the other side of the second conductor layer 22 via a conductive adhesive such as solder.

The second electronic element 23 may be a switching element or a control element. When the second electronic element 23 is the switching element, the second electronic element 23 may be a MOSFET, an IGBT, or the like.

As an example, each of the support parts 65 may abut on the first conductor layer 12. The first conductor layer 12 connected to the support part 65 may not be electrically connected to the other first conductor layer 12, the second conductor layer 22, the first electronic element 13, and the second electronic element 23.

The first head part 61 may have a substantially rectangular shape in a plan view (see FIG. 2). In this case, the support parts 65 may be provided to correspond to three sides or four sides of the first head part 61. The first head part 61 corresponds to the "substantially rectangular shape" when having four opposing sides, and corresponds to the "substantially rectangular shape" whether having a right-angle corner or an arcuate corner. Although the description is given using the aspect in which the four support parts 65 are provided in the present embodiment, the invention is not limited thereto, and the aspect in which the three support parts 65 are provided as illustrated in the second embodiment, which will be described later, may be used.

Widths of the support parts 65 may be different from each other. In the aspect illustrated in FIG. 2, the second support part 65b provided on the right side of FIG. 2 has a wider width than the first support part 65a provided on the left side of FIG. 2, and the third support part 65c provided on the upper side of FIG. 2 and the fourth support part 65d provided on the lower side of FIG. 2 have wider widths than the second support part 65b. In the aspect illustrated in FIG. 2, the widths of the third support part 65c and the fourth support part 65d are the same.

Figure 3:
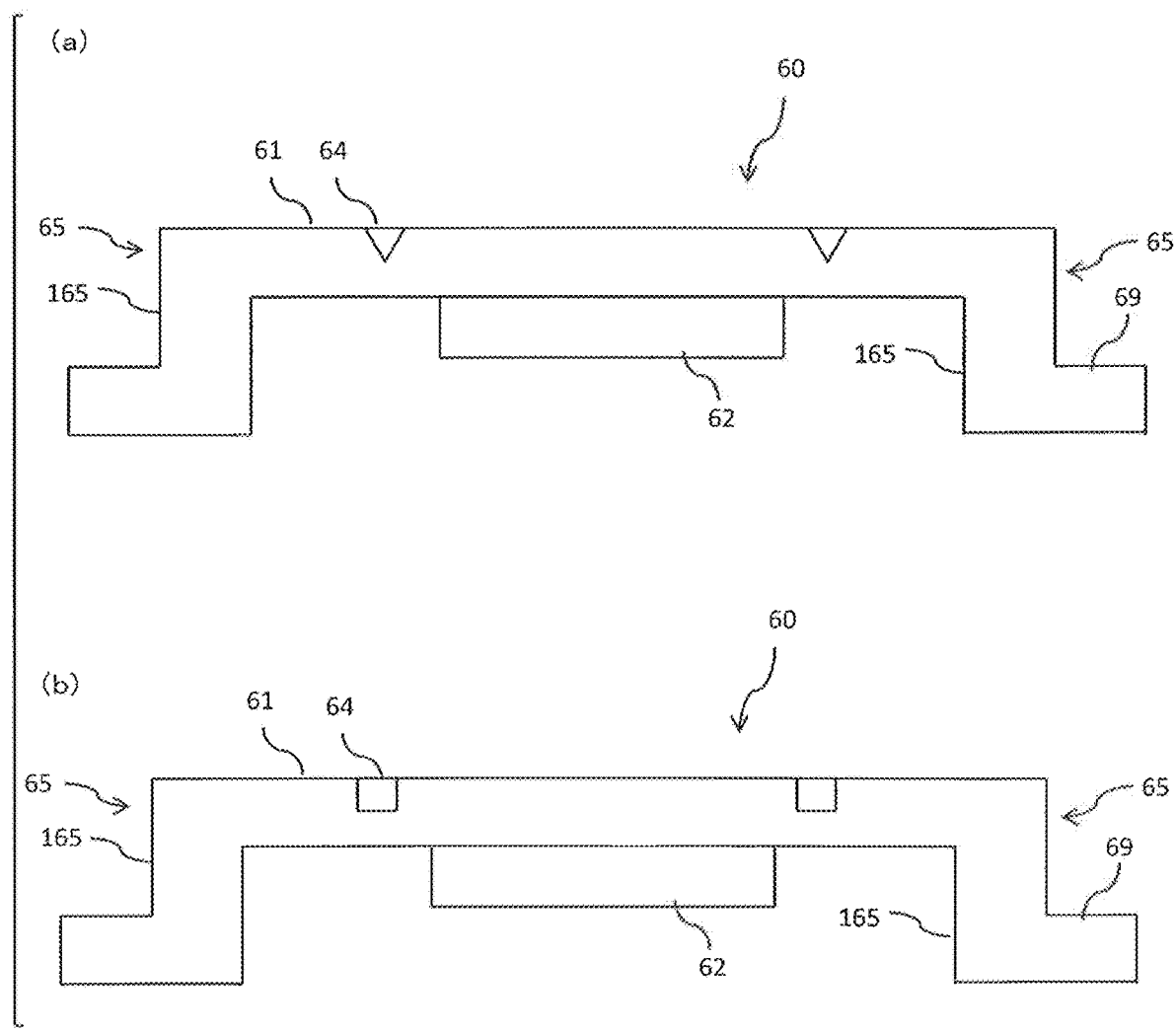
FIG. 3(a) is a longitudinal sectional view of a first connection body that can be used in the first embodiment of the present invention.
FIG. 3(b) is a longitudinal sectional view of another first connection body that can be used in the first embodiment of the present invention.

As illustrated in FIG. 1, the first connection body 60 may have a first pillar part 62 extending from the first head part 61 to the other side. As illustrated in FIG. 2, a first groove part 64 may be provided on a face on one side of the first head part 61. The first groove part 64 may be provided on at least a part of a circumference of the first pillar part 62 in a plan view or may be provided on the entire circumference of the first pillar part 62. A cross section of the first groove part 64 may be a rectangular shape as illustrated in FIG. 3(b), or may be a triangular shape as illustrated in FIG. 3(a). The triangular shape may be a right-angled triangle or an isosceles triangle.

As illustrated in FIG. 1, the second connection body 70 may have a second head part 71 and a second pillar part 72 extending from the second head part 71 to the other side.

Figure 4:
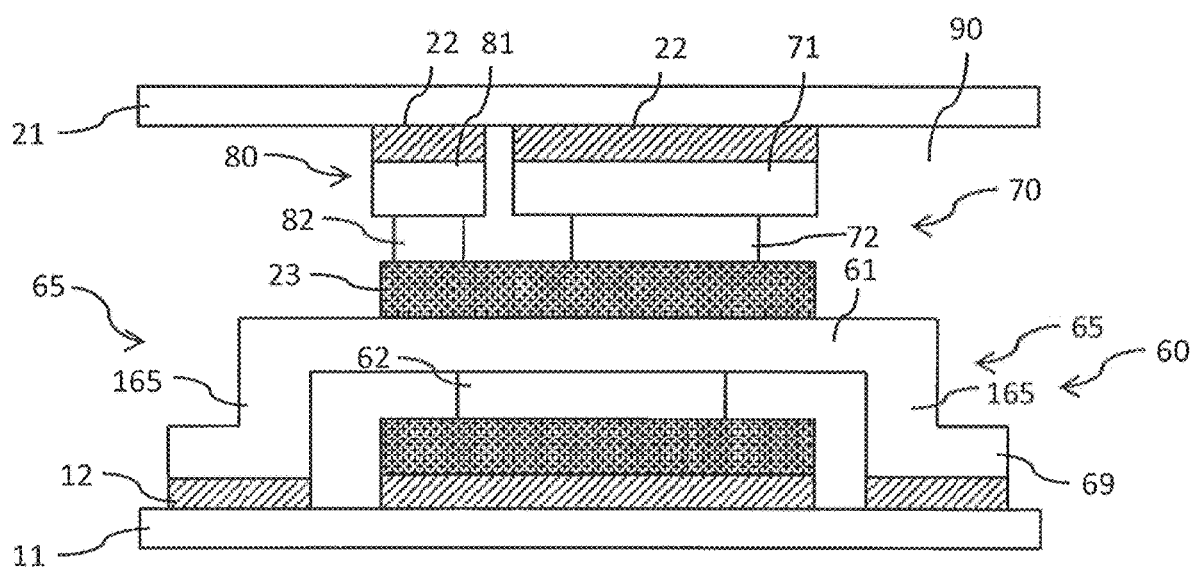
FIG. 4 is a longitudinal sectional view, taken along a cross section different from that in FIG. 1, of the electronic module that can be used in the first embodiment of the present invention.
Figure 4:
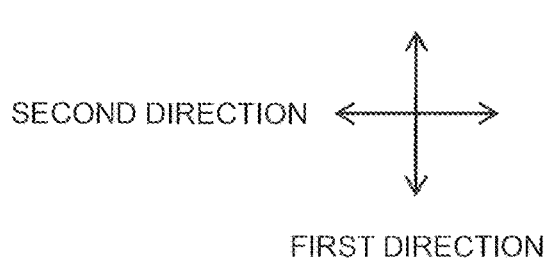

As illustrated in FIG. 4, a third connection body 80 may be provided on one side of the second electronic element 23. The third connection body 80 may have a third head part 81 and a third pillar part 82 extending from the third head part 81 to the other side. The third connection body 80 may be connected to the face on the other side of the second conductor layer 22 and the face on one side of the second electronic element 23 via a conductive adhesive such as solder. In addition, a general connector 85 (see FIG. 12) may be used as the third connection body 80 instead of one whose longitudinal section having the third pillar part 82 is a substantially T-shape.

As illustrated in FIG. 2, an aspect in which the first electronic element 13 is exposed to the outside from the first head part 61 in a plan view may be provided. When the first electronic element 13 is the switching element such as the MOSFET, a first gate terminal 13g or the like may be provided in a part exposed from the outside. Similarly, when the second electronic element 23 is the switching element such as the MOSFET, a second gate terminal 23g or the like may be provided on the face on one side thereof. The first electronic element 13 illustrated in FIG. 2 has the first gate terminal 13g and a first source terminal 13s on the face on one side thereof, and the second electronic element 23 has the second gate terminal 23g and a second source terminal 23s on the face on one side thereof. In this case, the second connection body 70 may be connected to the second source terminal 23s of the second electronic element 23 via the conductive adhesive, and the third connection body 80 may be connected to the second gate terminal 23g of the second electronic element 23 via the conductive adhesive. In addition, the first connection body 60 may connect the first source terminal 13s of the first electronic element 13 and a second drain terminal provided on the other side of the second electronic element 23 via a conductive adhesive. A first drain terminal provided on the other side of the first electronic element 13 may be connected to the first conductor layer 12 via a conductive adhesive. The first gate terminal 13g of the first electronic element 13 may be connected to a fourth connection body (for example, a connector 85 in FIG. 5) via a conductive adhesive, and the fourth connection body may be connected to the first conductor layer 12 via a conductive adhesive.

When only one of the first electronic element 13 and the second electronic element 23 is the switching element, it is also conceivable that the second electronic element 23 to be placed on the first connection body 60 is used as a control element with a low heat-generating property and the first electronic element 13 is used as the switching element. Conversely, it is also conceivable that the second electronic element 23 to be placed on the first connection body 60 is used as the switching element and the first electronic element 13 is used as the control element with the low heat-generating property.

As illustrated in FIG. 2, the support part 65 may have plane-direction support parts 166 (166a to 166d) extending in the plane direction from the first head part 61, and a height-direction support part 165 (see FIG. 1) extending in the height direction (first direction) from the plane-direction support part 166. Incidentally, the plane-direction support part 166 means a part in which a size in the width direction is smaller than that of the first head part 61.

The electronic module may have a sealing part 90 configured using a sealing resin or the like that seals the first electronic element 13, the second electronic element 23, the first connection body 60, the second connection body 70, the third connection body 80, the first conductor layer 12, and the second conductor layer 22.

The first conductor layer 12 may be connected to a terminal part (not illustrated), and a distal end side of the terminal part may be exposed to the outside of the sealing part 90 so as to be connectable to an external device.

In addition, a chip module may be configured of the first electronic element 13, the second electronic element 23, the first connection body 60, the second connection body 70, the third connection body 80, and the fourth connection body. In this case, the electronic module may be manufactured by arranging the chip module, which has the first electronic element 13, the second electronic element 23, the first connection body 60, the second connection body 70, the third connection body 80, and the fourth connection body, between the first substrate 11 provided with the first conductor layer 12 and the second substrate 21 provided with the second conductor layer 22, and then, sealing the chip module with the sealing part 90.

A ceramic substrate, an insulating resin layer, or the like can be employed as the first substrate 11 and the second substrate 21. A material containing Ag or Cu as a main component can be used as the conductive adhesive other than solder. Metal such as Cu can be used as a material of the first connection body 60 and the second connection body 70. Incidentally, a metal substrate subjected to circuit patterning, for example, can be used as the substrates 11 and 21, and in this case, the substrates 11 and 21 also serve as the conductor layers 12 and 22.

Bonding between the terminal part and the conductor layers 12 and 22 is not limited to the aspect of using the conductive adhesive such as solder, and laser welding or ultrasonic bonding may be used.

Operation and Effect

Next, an example of an operation and an effect according to the present embodiment having the above-described configuration will be described. Incidentally, all the aspects described in the "operation and effect" can be employed in the above-described configuration.

In the present embodiment, when the aspect in which the plurality of support parts 65 extending from the first head part 61 are provided and the support parts 65 abut on the first substrate 11 or the first conductor layer 12 is used as illustrated in FIGS. 1 and 2, the first connection body 60 can be prevented from being inclined due to the weight of the second electronic element 23 at the time of mounting the second electronic element 23 or after mounting the second electronic element 23. In addition, since the plurality of support parts 65 abut on the first substrate 11 or the first conductor layer 12 in this manner, the heat dissipation can be enhanced. In particular, when the support part 65 abuts on the first conductor layer 12, it is advantageous in terms that the heat dissipation effect can be further enhanced.

In addition, heat is easily confined when each of the first electronic element 13 and the second electronic element 23 is the switching element. However, when the aspect in which the plurality of support parts 65 abut on the first substrate 11 or the first conductor layer 12, it is advantageous in terms that the heat can be efficiently released.

When adopting the aspect in which first conductor layer 12 connected to the support part 65 is not electrically connected to the other first conductor layer 12, the second conductor layer 22, the first electronic element 13, and the second electronic element 23 not to perform an electrical function, it is advantageous in terms that the first electronic element 13 and the second electronic element 23 can be prevented from exhibiting unexpected behavior due to the conduction of the support part 65.

When adopting the aspect in which the three or more support parts 65 are provided, it is advantageous in terms that higher stability and heat dissipation can be realized. As illustrated in FIG. 2, when adopting the aspect in which the four support parts 65 are provided, it is advantageous in terms that even higher stability and heat dissipation can be realized.

As illustrated in FIG. 1, when adopting the aspect in which the first connection body 60 has the first pillar part 62, it is advantageous in terms that the first electronic element 13 and the second electronic element 23 can be separated from each other to a certain extent and heat can be released.

As illustrated in FIG. 2, when adopting the aspect in which the first electronic element 13 is exposed from the first head part 61 in a plan view, it is advantageous in terms that the first electronic element 13 and the second electronic element 23 provided in the first head part 61 can be shifted from each other in the plane direction and hence heat can be easily released. Incidentally, the reason why the first electronic element 13 is exposed from the first head part 61 in a plan view as described above while having the four support parts 65 is because the plane-direction support part 166 is provided.

In addition, when adopting the aspect in which the first terminal such as the first gate terminal 13g of the first electronic element 13 is exposed from the first head part 61 in a plan view as illustrated in FIG. 2, it is advantageous in terms that a process of connecting a connector or a wire to the first gate terminal 13g can be performed after placing the first connection body 60.

As illustrated in FIG. 2, when adopting the aspect in which the width of the plane-direction support part 166a of the first support part 65a extending in the direction in which the terminal such as the first gate terminal 13g of the first electronic element 13 is provided is narrower than the widths of the plane-direction support parts 166b to 166d of the other support parts 65b to 65d, it is advantageous in terms that a space for connecting the connector or wire to the first gate terminal 13g can be secured.

As illustrated in FIG. 1, when adopting the aspect in which the second connection body 70 has the second pillar part 72 extending from the second head part 71 to the other side, a space can be provided on one side of the second electronic element 23 so that heat generated from the second electronic element 23 can be prevented from being confined. Similarly, even when adopting the aspect in which the third connection body 80 has the third pillar part 82 extending from the third head part 81 to the other side as illustrated in FIG. 4, a space can be provided on one side of the second electronic element 23 so that heat generated from the second electronic element 23 can be prevented from being confined.

Second Embodiment

Next, a second embodiment of the present invention will be described.

Figure 5:
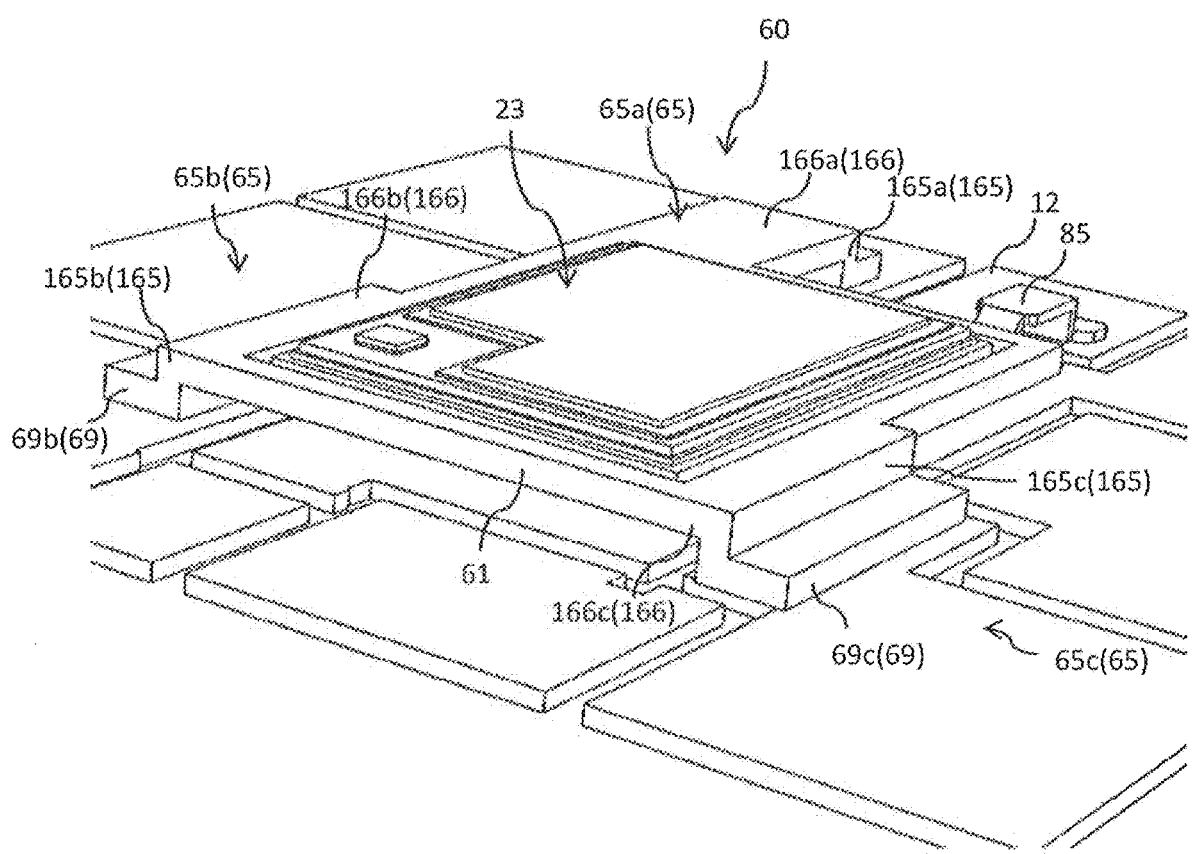
FIG. 5 is a perspective view of an electronic module that can be used in a second embodiment of the present invention.
Figure 6:
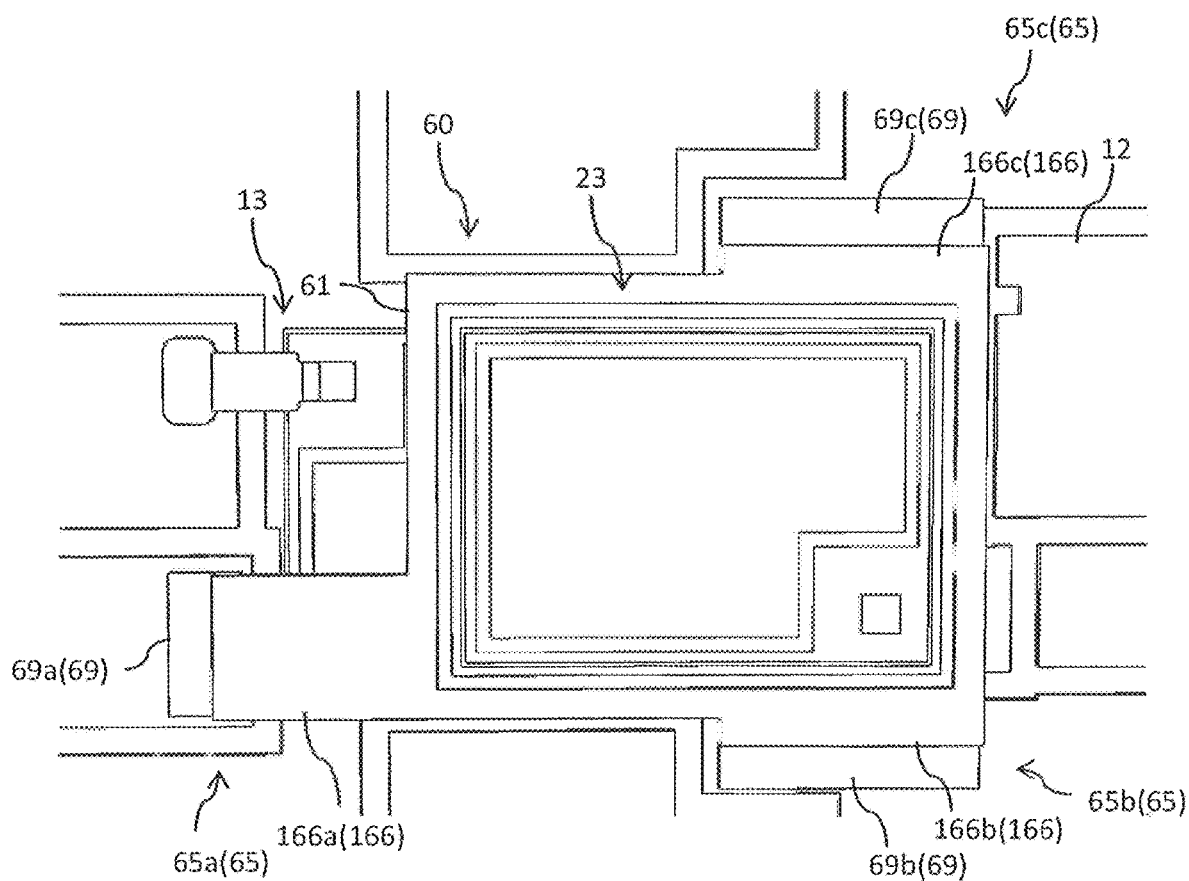
FIG. 6 is a plan view of the electronic module that can be used in the second embodiment of the present invention.

In the present embodiment, three support parts 65 (65a to 65c) are provided as illustrated in FIGS. 5 and 6. The other configurations are the same as those in the first embodiment, and all the aspects that have been described in the first embodiment can be adopted. The members that have been described in the first embodiment will be described using the same reference signs.

According to the aspect in which the three support parts 65 are used as in the present embodiment, it is advantageous in terms that the area in a plan view can be reduced as much as the number of the support parts 65 decreases as compared with an aspect in which four or more support parts 65 are provided. In addition, the support parts 65 can be stably supported even in the aspect in which only the three support parts 65 are provided.

Even when adopting an aspect in which the plane-direction support part 166 is not provided, the first electronic element 13 and the second electronic element 23 can be arranged to be shifted from each other in a plan view by adopting the aspect in which the three support parts 65 are provided. When arranging the first electronic element 13 and the second electronic element 23 to be shifted from each other in this manner, heat dissipation efficiency can be suppressed from lowering due to overlap of mutual heat.

Figure 7:
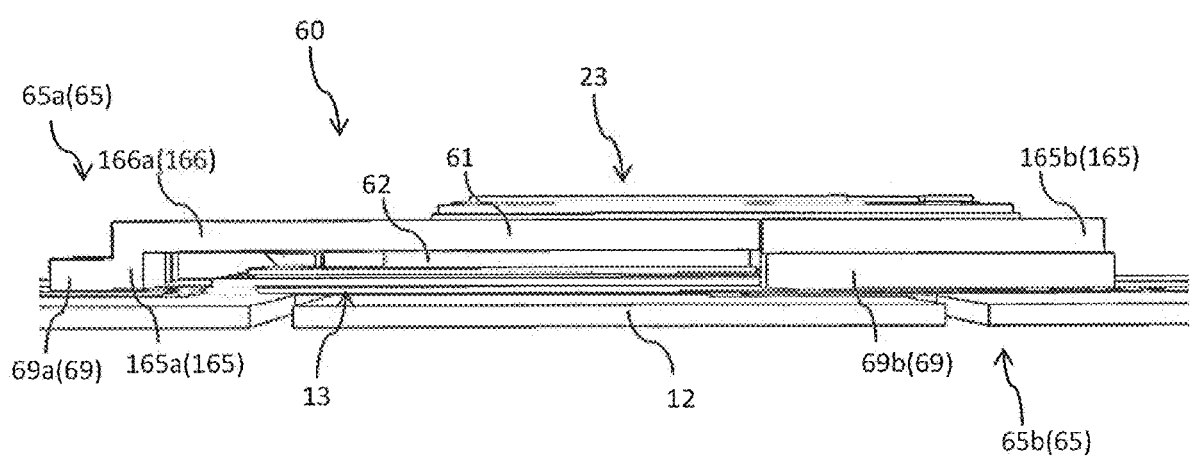
FIG. 7 is a side view of the electronic module that can be used in the second embodiment of the present invention.
Figure 7:
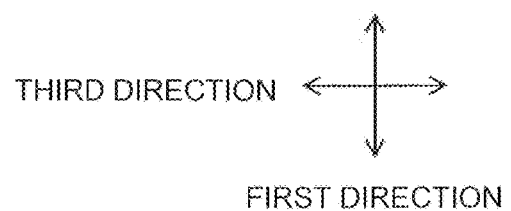

In addition, when the first pillar part 62 is provided at a location where the second support part 65b and the third support part 65c are not provided as viewed along the second direction as illustrated in FIG. 7, it is advantageous in terms that the first connection body 60 can be provided with a very stable aspect.

Incidentally, for example, when each of the first electronic element 13 and the second electronic element 23 has the high heat-generating property as in the case of being configured using the switching element, it is conceivable to adopt an aspect in which the four support parts 65 as in the first embodiment or five or more support parts 65 are provided. On the other hand, if only one of the first electronic element 13 and the second electronic element 23 is the switching element, it is also conceivable to adopt the aspect in which the three support parts 65 are provided as in the second embodiment.

Third Embodiment

Next, a third embodiment of the present invention will be described.

Figure 8:
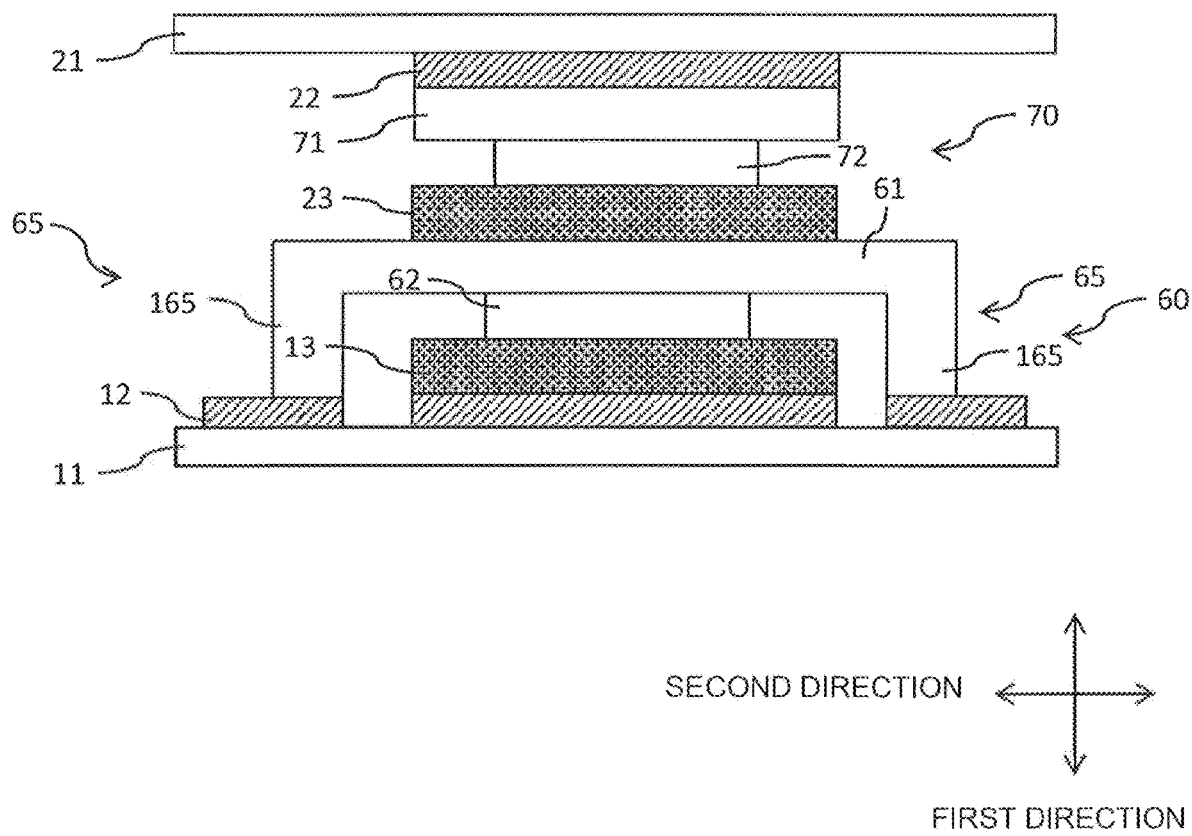
FIG. 8 is a longitudinal sectional view of an electronic module that can be used in a third embodiment of the present invention.
Figure 9:
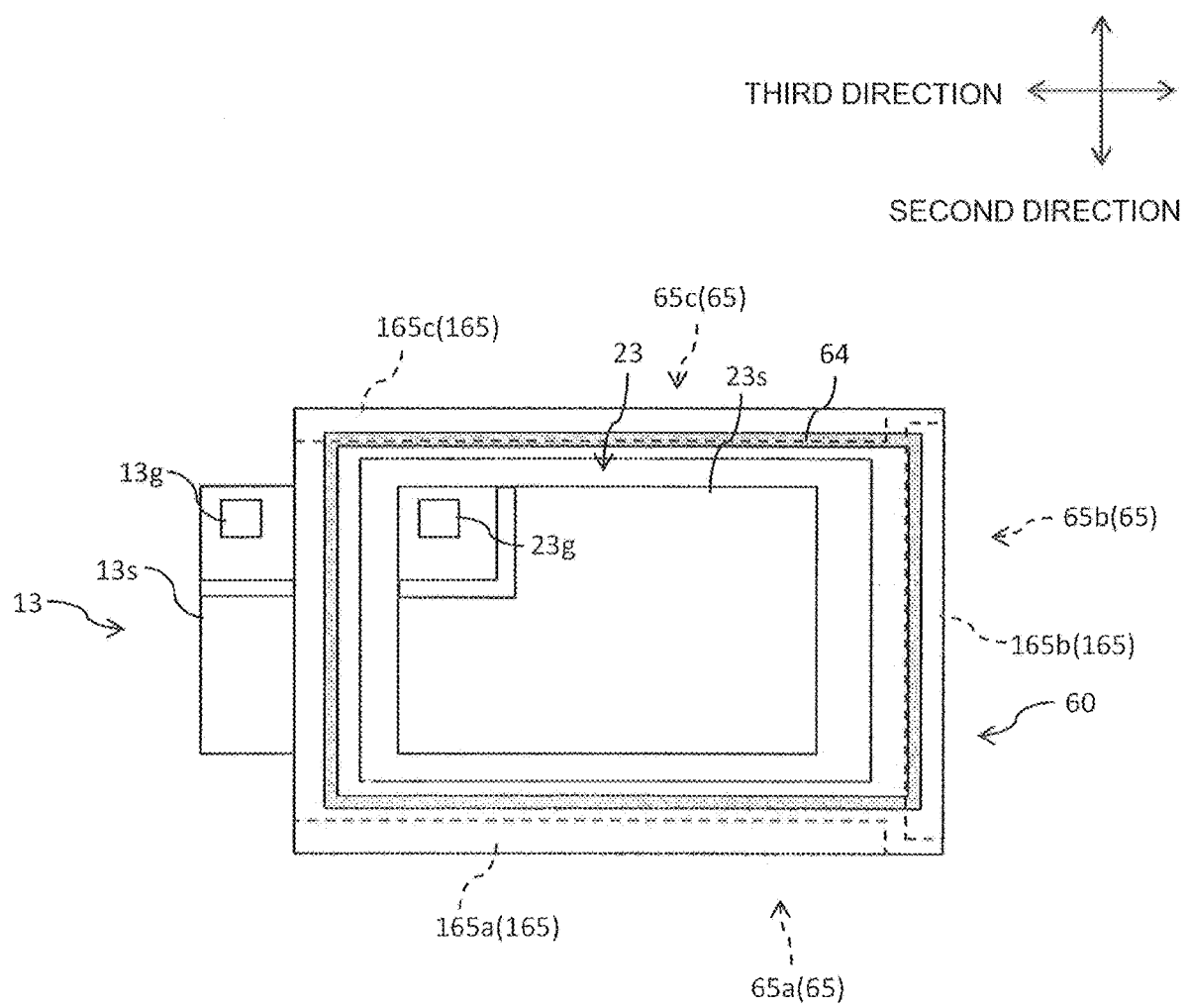
FIG. 9 is a plan view of the electronic module that can be used in the third embodiment of the present invention.

In the present embodiment, the support part 65 does not have the plane-direction support part 166 but has only the height-direction support part 165 and extends linearly from the face on the other side of the first head part 61 toward the first substrate 11 or the first conductor layer 12 as illustrated in FIGS. 8 and 9. In addition, the present embodiment is given as an aspect the support proximal end part extending in the plane direction is not provided. As for the other configurations, all the aspects that have been described in the above-described respective embodiments can be adopted. The members that have been described in the above-described respective embodiments will be described using the same reference signs.

According to the present embodiment, since the support part 65 extends linearly from the face on the other side of the first head part 61 toward the first substrate 11 or the first conductor layer 12, it is advantageous in terms that a size in the plane direction (the second direction and the third direction) can be made small.

In addition, when adopting the three support parts 65 (65a to 65c) as illustrated in FIG. 9, it is advantageous in terms that the first electronic element 13 and the second electronic element 23 can be arranged to be shifted from each other in the plane direction and an overlapping region of heat generation between the first electronic element 13 and the second electronic element 23 can be reduced.

Incidentally, although the fact that the support proximal end part 69 is not provided has been described as above, the invention is not limited thereto, and the support proximal end part 69 may be provided. In addition, it is not necessary to provide the support proximal end part 69 in each of the plurality of support parts 65, and the support proximal end part 69 may be provided in some of the plurality of support parts 65 and the support proximal end part 69 may not be provided in the other support parts 65.

Fourth Embodiment

Next, a fourth embodiment of the present invention will be described.

Figure 10:
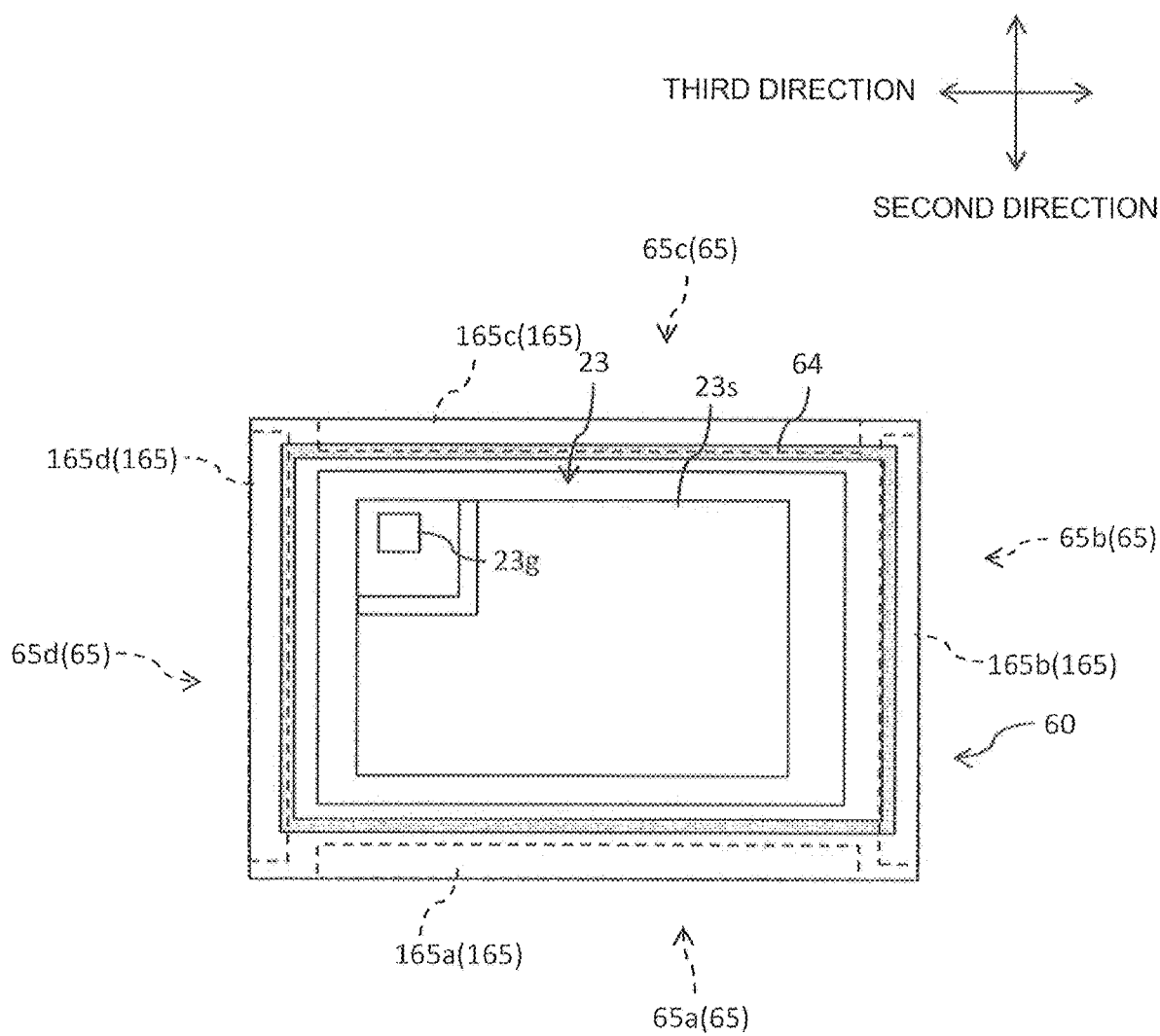
FIG. 10 is a plan view of an electronic module that can be used in a fourth embodiment of the present invention.

The third embodiment is the aspect in which the three support parts 65 each of which does not have the plane-direction support part 166 are provided, and each of the support parts 35 is provided in the aspect of extending linearly from the face on the other side of the first head part 61 toward the first substrate 11 or the first conductor layer 12. In the present embodiment, however, four support parts 65 (65a to 65d) each of which does not have the plane-direction support part 166 are provided, and each of the support parts 35 linearly extends from the face on the other side of the first head part 61 toward the first substrate 11 or the first conductor layer 12 as illustrated in FIG. 10. As for the other configurations, all the aspects that have been described in the above-described respective embodiments can be adopted. The members that have been described in the above-described respective embodiments will be described using the same reference signs. Incidentally, although the description is given using the aspects in which the number of the support parts 65 is three and four in the third embodiment and the fourth embodiment, the invention is not limited thereto, and the first head part 65 may have a pentagonal shape or a shape with more angles in a plan view and five or more support parts 65 may be provided.

According to the present embodiment, height-direction support parts 165a to 165d of the four support parts 65a to 65d linearly extend from the face on the other side of the first head part 61 toward the first substrate 11 or the first conductor layer 12, and thus, the first connection body 60 can be more stably provided as compared with the third embodiment. Since the number of the support parts 65 is larger than that in the third embodiment, the high heat dissipation using the first connection body 60 can be expected as compared with the third embodiment.

On the other hand, since the support part 65 extends from each side of the first head part 61 on a substantially rectangular shape in the present embodiment, the first electronic element 13 is surrounded from all directions. However, heat generated from the second electronic element 23 can be efficiently dissipated by the first connection body 60 by providing the four support parts 65, and thus, it is preferable to adopt the aspect of the present embodiment in some cases.

Incidentally, even in the present embodiment, the support proximal end part 69 may be provided or the support proximal end part 69 may not be provided. In addition, it is not necessary to provide the support proximal end part 69 in each of the plurality of support parts 65, and the support proximal end part 69 may be provided in some of the plurality of support parts 65 and the support proximal end part 69 may not be provided in the other support parts 65.

Fifth Embodiment

Next, a fifth embodiment of the present invention will be described.

Figure 11:
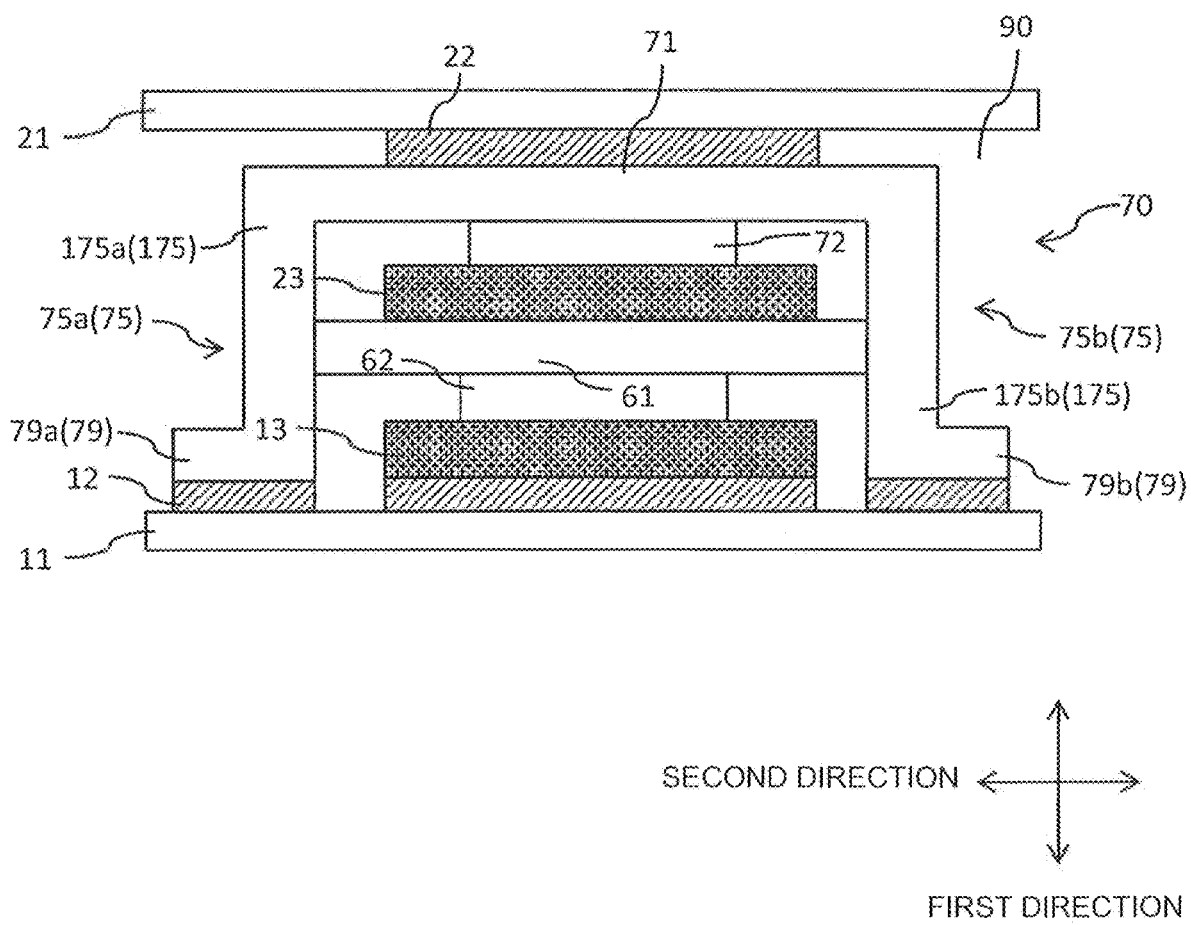
FIG. 11 is a longitudinal sectional view of an electronic module that can be used in a fifth embodiment of the present invention.

The description has been given using the second connection body 70 having a substantially T-shaped cross section in the above-described respective embodiments. In the present embodiment, however, the second connection body 70 has an extending part 75 extending from the second head part 71 to the other side as illustrated in FIG. 11. As for the other configurations, all the aspects that have been described in the above-described respective embodiments can be adopted. The members that have been described in the above-described respective embodiments will be described using the same reference signs. Incidentally, the support part 65 overlaps the extending part 75, and the support part 65 is not visible in FIG. 11.

Each of the extending parts 75 may abut on the first substrate 11 or the first conductor layer 12. As an example, each of the extending parts 75 may abut on the first conductor layer 12. The first conductor layer 12 connected to the extending part 75 may not be electrically connected to the other first conductor layer 12, the second conductor layer 22, the first electronic element 13, and the second electronic element 23.

Since the extending part 75 is provided according to the present embodiment, heat from the second electronic element 23 can be more efficiently dissipated, and a high heat dissipation effect can be also realized by the second connection body 70.

When adopting the aspect in which two or more extending parts 75 provided on one side of the first conductor layer 12 are provided, a higher heat dissipation effect can be realized by the second connection body 70. Although the description is given using the aspect in which the two extending parts 75 are provided in the present embodiment, the invention is not limited thereto, and three extending parts 75 may be used as illustrated in a sixth embodiment, which will be described later, or four or more extending parts 75 may be used.

When adopting the aspect of the present embodiment, a repulsive force that pushes the second substrate 21 back to one side can be imparted by the second connection body 70. That is, when heat is applied in a manufacturing process or the like, a force to warp or distort the first substrate 11 and the second substrate 21 is applied. However, when using the second connection body 70 having the plurality of extending parts 75, it is advantageous in terms that the warpage and distortion of the first substrate and the second substrate can be prevented.

The second head part 71 of the second connection body 70 may be provided so as to straddle the second electronic element 23. As illustrated in FIG. 11, the extending part 75 may have a first extending part 75a extending from one of circumferential parts of the second head part 71 and a second extending part 75b extending from another circumferential part of the head part. When adopting this aspect, it is advantageous in terms that the second connection body 70 can be arranged on the first substrate 11 or the first conductor layer 12 in a more balanced manner.

When the extending part 75 has an extending proximal end part 79 extending in the plane direction, the second connection body 70 can be arranged on the first substrate 11 or the first conductor layer 12 in a more balanced manner, and further, a contact area with the first substrate 11 or the first conductor layer 12 can be increased with the extending proximal end part 79, and thus, the heat dissipation effect can be enhanced.

Incidentally, when the extending part 75 has a first extending part 75*a* and a second extending part 75*b*, the first extending part 75*a* may have a first extending proximal end part 79*a* and the second extending part 75*b* may have a second extending proximal end part 79*b*.

Sixth Embodiment

Next, a sixth embodiment of the present invention will be described.

Although the aspect in which the two extending parts 75 are provided has been described in the fifth embodiment, an aspect in which three extending parts 75 (75*a* to 75*c*) are provided is described in the present embodiment. As for the other configurations, all the aspects that have been described in the above-described respective embodiments can be adopted. The members that have been described in the above-described respective embodiments will be described using the same reference signs.

The extending part 75 may have plane-direction extending parts 176 (176*a* to 176*c*) extending in the plane direction from the second head part 71, height-direction extending parts 175 (175*a* to 175*c*) extending in the height direction (first direction) from the plane-direction extending parts 176. Incidentally, the plane-direction extending part 176 means a part whose size in the width direction is smaller than that of the second head part 71.

Each of the plane-direction extending part 176 of the extending part 75 and the plane-direction support part 166 of the support part 65 may extend in directions not overlapping each other in a plan view. When adopting such an aspect, it is advantageous in terms that the size in the plane direction can be reduced.

Figure 12:
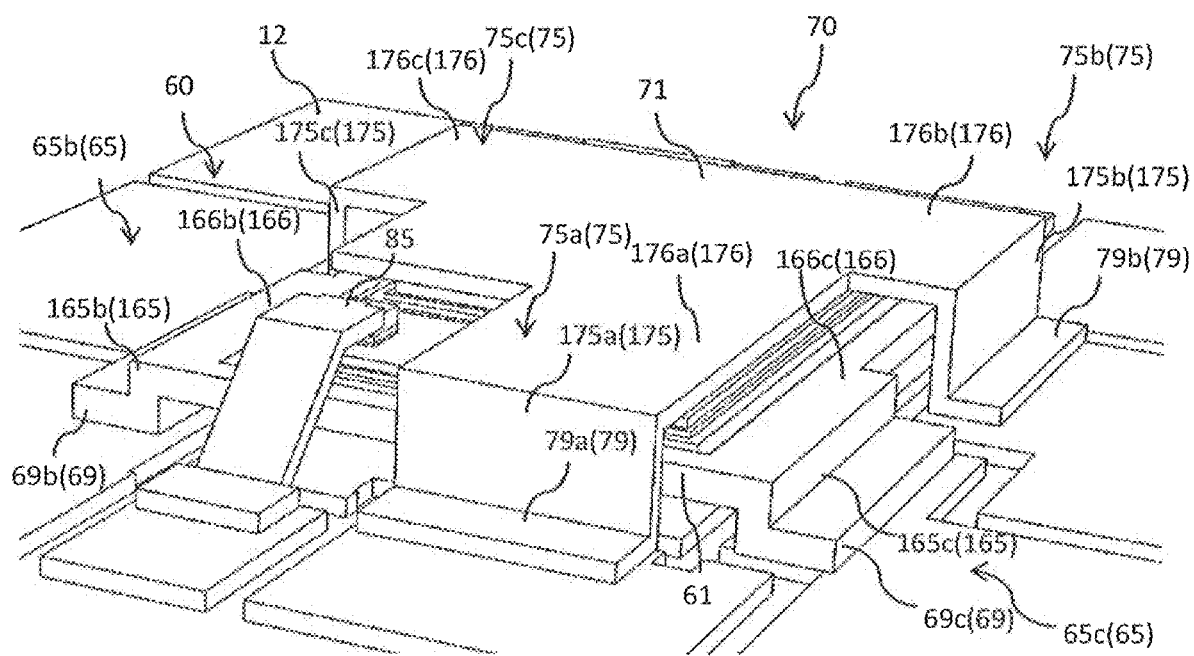
FIG. 12 is a perspective view of an electronic module that can be used in a sixth embodiment of the present invention.
Figure 13:
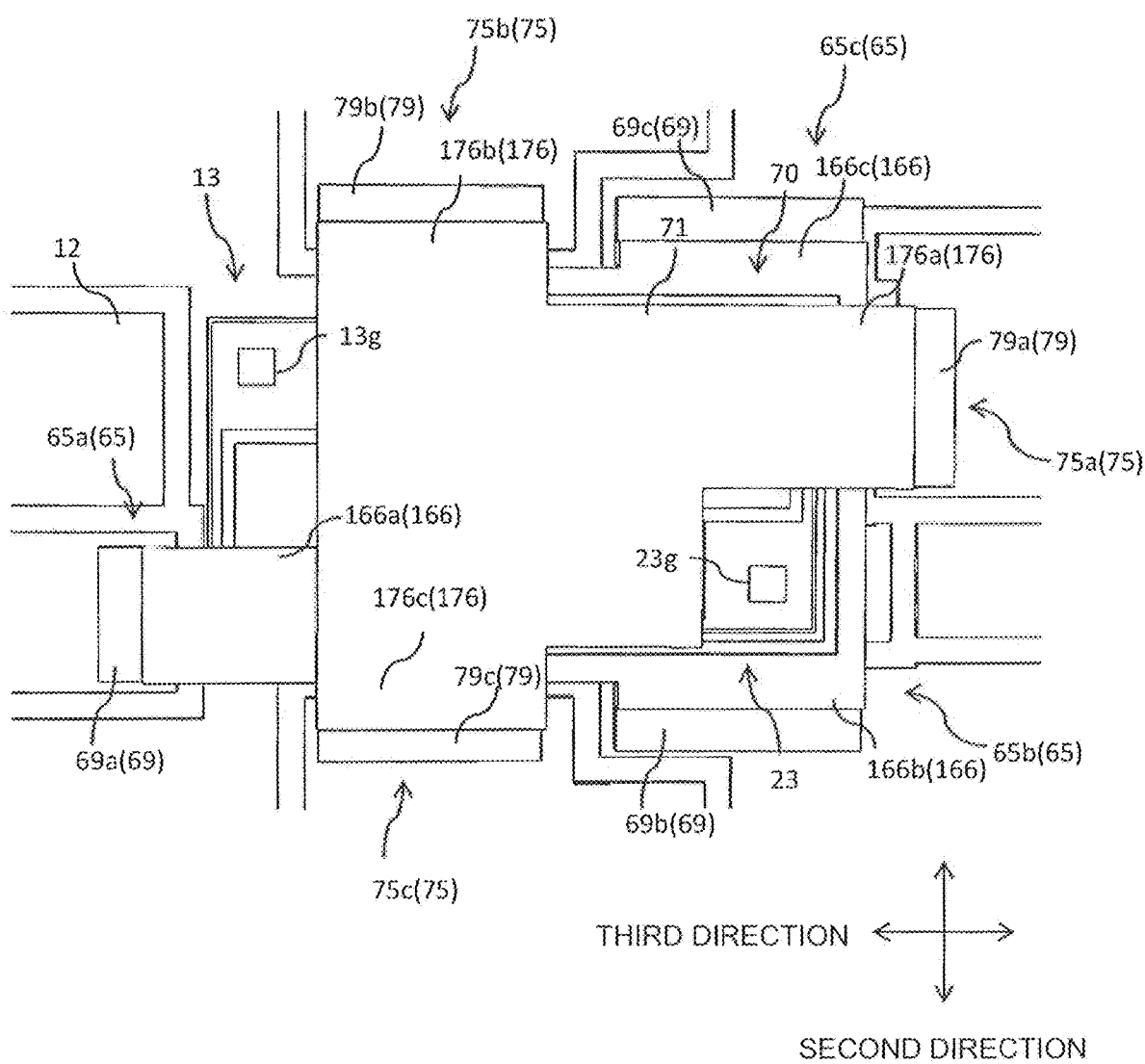
FIG. 13 is a plan view of the electronic module that can be used in the sixth embodiment of the present invention.
Figure 14:
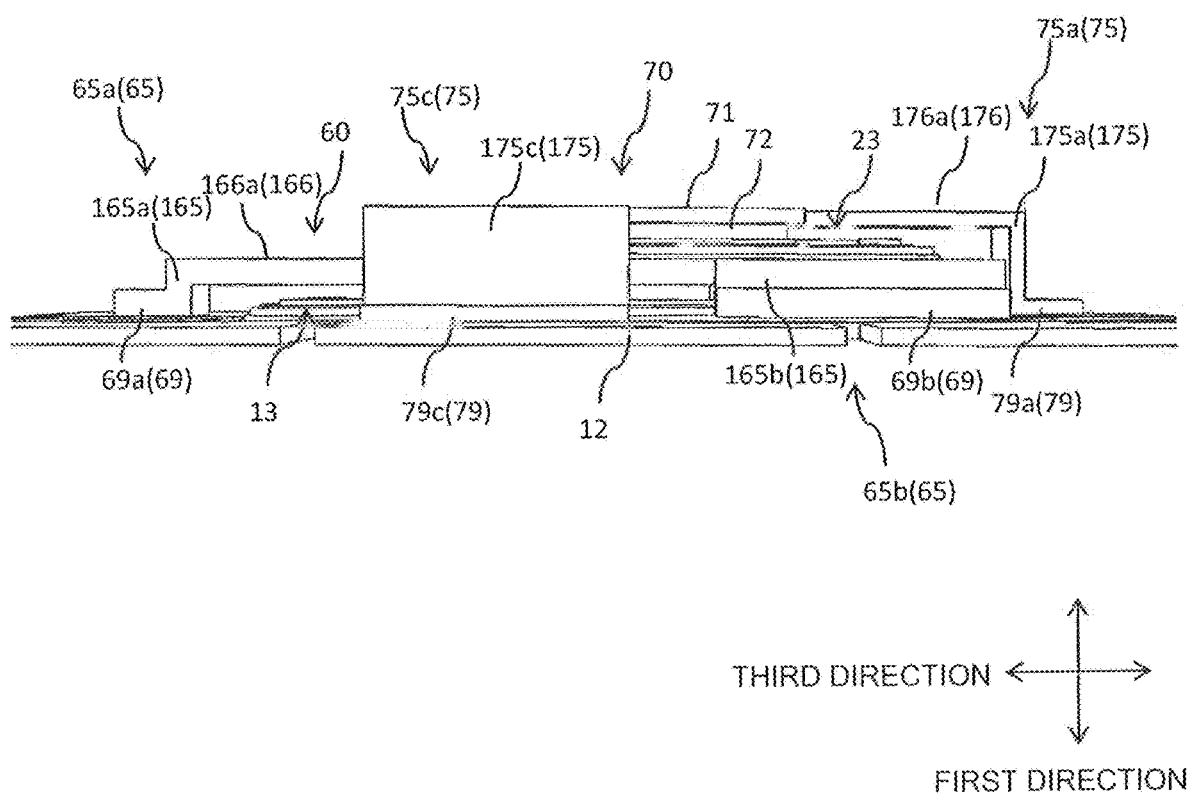
FIG. 14 is a side view of the electronic module that can be used in the sixth embodiment of the present invention.

More specifically, in an aspect illustrated in FIGS. 12 to 14, the first extending part 75*a*, the second extending part 75*b*, and the third extending part 75*b* are provided, and the first support part 65*a*, the second support part 65*b*, and the third support part 65*b* are provided. Further, the first extending part 75*a* has a first plane-direction extending part 176*a* and a first height-direction extending part 175*a*, the second extending part 75*b* has a second plane-direction extending part 176*b* and a second height-direction extending part 175*b*, and the third extending part 75*c* has a third plane-direction extending part 176*c* and a third height-direction extending part 175*c*. The first support part 65*a* has the first plane-direction support part 166*a* and the first height-direction support part 165*a*, the second support part 65*b* has the second plane-direction support part 166*b* and the second height-direction support part 165*b*, and the third support part 65*c* has the third plane-direction support part 166*c* and the third height-direction support part 165*c*.

Further, a direction (rightward direction in FIG. 13) in which the first plane-direction extending part 176*a* extends from the second head part 71 and a direction (leftward direction in FIG. 13) in which the first plane-direction support part 166*a* extends from the first head part 61 are opposite to each other in a plan view as illustrated in FIG. 13. In addition, a direction (upward direction in FIG. 13) in which the second plane-direction extending part 176*b* extends from the second head part 71 and a direction (upward direction in FIG. 13) in which the third plane-direction support part 166*c* extends from the first head part 61 are the same direction, but these directions are arranged to be shifted from each other in the third direction of the plane direction. In addition, a direction (downward direction in FIG. 13) in which the third plane-direction extending part 176*c* extends from the second head part 71 and a direction (downward direction in FIG. 13) in which the second plane-direction support part 166*b* extends from the first head part 61 are the same direction, but these directions are also arranged to be shifted from each other in the third direction of the plane direction.

In addition, since the support part 65 has the plane-direction support part 166, the first electronic element 13 and the second electronic element 23 can be arranged to be shifted from each other in the third direction of the plane direction as illustrated in FIG. 14, and it is advantageous in terms that the overlapping region of heat generation between the first electronic element 13 and the second electronic element 23 can be reduced.

In addition, since the first electronic element 13 and the second electronic element 23 are arranged to be shifted from each other in the plane direction and each of the first terminal such as the first gate terminal 13*g* and the second terminal such as the second gate terminal 23*g* exposed from the second head part 71 in a plan view as illustrated in FIG. 13, it is advantageous in terms that a space for connecting a connector or a wire to the first gate terminal 13*g* and the second gate terminal 23*g* can be secured. In addition, a process of connecting the connector or wire to the first gate terminal 13*g* and the second gate terminal 23*g* can also be performed after the first connection body 60 and the second connection body 70 are placed.

The descriptions of the respective embodiments and the disclosure of the drawings described above are merely examples for describing the invention described in the claims, and the invention described in the claims is not limited by the descriptions of the embodiments or the disclosure of the drawings described above. In addition, the descriptions of the claims at the beginning of the application are merely examples, and the descriptions of the claims can be also appropriately changed based on the descriptions of the specification, the drawings, and the like.

REFERENCE SIGNS LIST

11 first substrate
12 first conductor layer
13 first electronic element
23 second electronic element
60 first connection body
61 first head part
62 first pillar part
65 support part
70 second connection body
72 second pillar part

The invention claimed is:
1. An electronic module comprising:
a first electronic unit having a first substrate, three or more first conductor layers provided on one side of the first substrate, and a first electronic element provided on one side of one of the first conductor layers;

a first connection body provided on one side of the first electronic element; and a second electronic unit having a second electronic element provided on one side of the first connection body, wherein the first connection body has a first head part, a first pillar part extending from the first head part to another side and a plurality of support parts extending from the first head part, the plurality of support parts abut on at least two of the first conductor layers, the first electronic element has a first terminal on a face on one side, the second electronic element has a second terminal on a face on the other side, the first connection body electrically connects the first terminal of the first electronic element and the second terminal of the second electronic element, and at least one of the first conductor layers, on which the support part abuts, does not perform an electrical function.

2. The electronic module according to claim 1, wherein a second connection body is provided on one side of the second electronic element, the second connection body has a plurality of extending parts, and the extending parts and the support parts extend in the same direction with each other in a plan view and do not overlap with each other in the plan view.

3. The electronic module according to claim 1, wherein three or more support parts are provided, at least two first conductor layers, on which the support parts abut, do not perform the electrical function, and at least one first conductor layer, on which the support part abuts, performs an electrical function.

4. The electronic module according to claim 1, wherein the first head part has a rectangular shape in a plan view, the support parts are provided to correspond to three sides or four sides of the first head part.

5. The electronic module according to claim 1, wherein the support part extends linearly from a face on the other side of the first head part toward the first substrate or the first conductor layer.

6. The electronic module according to claim 1, wherein the first electronic element is exposed from the first head part in a plan view.

7. The electronic module according to claim 1, wherein a second connection body is provided on one side of the second electronic element.

8. The electronic module according to claim 7, wherein the second connection body has a second head part and a second pillar part extending from the second head part to the other side.

9. An electronic module comprising:

a first electronic unit having a plurality of first substrates which are metal substrates, and a first electronic element provided on one side of one of the plurality of first substrates;

a first connection body provided on one side of the first electronic element; and a second electronic unit having a second electronic element provided on one side of the first connection body, wherein the first connection body has a first head part, a first pillar part extending from the first head part to another side and a plurality of support parts extending from the first head part, the plurality of support parts abut on at least two of the plurality of first substrates which are metal, the first electronic element has a first terminal on a face on one side, the second electronic element has a second terminal on a face on the other side, the first connection body electrically connects the first terminal of the first electronic element and the second terminal of the second electronic element, and at least one of the plurality of first substrates which are metal, on which the support part abuts, does not perform an electrical function.

* * * * *